United States Patent [19]
Scheler et al.

[11] Patent Number: 5,655,869
[45] Date of Patent: Aug. 12, 1997

[54] DEVICE FOR COUPLING LOADING AND UNLOADING DEVICES WITH SEMICONDUCTOR PROCESSING MACHINES

[75] Inventors: Werner Scheler; Berndt Lahne; Andreas Mages; Uwe Michl; Eberhard Gemkow; Alfred Schulz, all of Jena, Germany

[73] Assignee: Jenoptik Technologie GmbH, Jena, Germany

[21] Appl. No.: 430,816

[22] Filed: Apr. 28, 1995

[30]    Foreign Application Priority Data

Jul. 16, 1994 [DE] Germany .......................... 44 25 208.0

[51] Int. Cl.⁶ .................................................. B65G 49/07
[52] U.S. Cl. ......................... 414/222; 414/401; 414/785; 414/940
[58] Field of Search ........................ 414/217, 222, 414/411, 412, 401, 396, 584, 785, 935, 939, 940; 157/237, 244, 267, 344

[56]    References Cited

U.S. PATENT DOCUMENTS

| | | | |
|---|---|---|---|
| 4,015,535 | 4/1977 | Schumacher et al. | 187/344 X |
| 4,283,164 | 8/1981 | Reaney | 414/396 |
| 4,676,709 | 6/1987 | Bonora et al. | 414/940 X |
| 4,851,018 | 7/1989 | Lazzari et al. | 414/940 X |
| 4,886,412 | 12/1989 | Wooding et al. | 414/940 X |
| 4,923,054 | 5/1990 | Ohtani et al. | 187/267 |
| 4,923,352 | 5/1990 | Tamura et al. | 414/225 |
| 4,944,645 | 7/1990 | Suzuki | 414/217 |
| 4,948,979 | 8/1990 | Munakata et al. | 414/217 X |
| 5,139,459 | 8/1992 | Takahashi et al. | 414/217 X |
| 5,246,218 | 9/1993 | Yap et al. | 269/309 |
| 5,344,276 | 9/1994 | Juan | 414/584 |
| 5,364,219 | 11/1994 | Takahashi et al. | 414/939 X |
| 5,431,600 | 7/1995 | Murata et al. | 414/411 X |

FOREIGN PATENT DOCUMENTS

| | | | |
|---|---|---|---|
| 0244772 | 11/1987 | European Pat. Off. | |
| 552756 | 7/1993 | European Pat. Off. | 414/940 |
| 0596537 | 11/1994 | European Pat. Off. | |
| 2696429 | 4/1994 | France . | |
| 4 306 957 | 6/1994 | Germany . | |
| 4326309 | 9/1994 | Germany | 414/940 |
| 274186 | 5/1989 | Japan | 414/940 |
| 74923 | 3/1993 | Japan | 414/940 |
| 658570 | 10/1951 | United Kingdom | 414/785 |
| 18543 | 9/1993 | WIPO | 414/940 |

Primary Examiner—David A. Bucci
Attorney, Agent, or Firm—McAulay Fisher Nissen Goldberg & Kiel, LLP

[57]    ABSTRACT

The object of a device for coupling loading and unloading devices with semiconductor machines is to couple devices required for the use of SMIF technology with semiconductor processing machines in which subsequent integration of SMIF technology is not possible, wherein the charging to be carried out after coupling is highly flexible and capable of managing increasing dimensions of semiconductor wafers. An adjustable receiving element for the loading and unloading device is provided inside a movable enclosure, this receiving element being displaceable between at least two planes situated one above the other, one plane serving for charging the loading and unloading device and every other plane being used for the charging of the semiconductor machine carried out by the loading and unloading device. The enclosure has aligning and holding elements for fastening to a coupling element which is aligned with the semiconductor processing machine. The device enables retrofitting of semiconductor processing planes with SMIF technology while taking into account ergonomic requirements.

11 Claims, 15 Drawing Sheets

DEVICE FOR COUPLING LOADING AND UNLOADING DEVICES WITH SEMICONDUCTOR PROCESSING MACHINES

BACKGROUND OF THE INVENTION a) Field of the Invention

The invention is directed to a device for coupling loading and unloading devices with semiconductor processing machines to enable retrofitting of such machines with SMIF technology while taking into account ergonomic requirements.

b) Description of the Related Art

In the manufacture of integrated circuits, semiconductor wafers must be transported between different processing steps to individual processing machines. This is effected to an increasing extent in standardized transport containers, so-called Standard Mechanical Interface boxes (SMIF boxes), since, instead of optimizing conventional clean rooms by way of higher grades of purity to achieve greater density of integration, rigorously implemented use of enclosures or the use of SMIF technology in semiconductor processing machines provides a way to achieve higher yields at reasonable cost.

The magazine having shelves in which the semiconductor wafers are located is attached in a suitable manner to the bottom of the SMIF box which has a relatively small closed volume.

In order to charge the processing machines, the magazines are unloaded from the transport containers, e.g., by a loading and unloading device according to German Patent 43 26 309 C1 or a device performing a different sequence of operations, and is placed in the processing machine. After the semiconductor wafers are processed, the magazines are transported back in the transport containers. Since the spatial arrangement of the loading and unloading devices is normally governed by the processing cycle in the machine, charging of the loading and unloading device with magazines or with magazines in transport containers and accordingly manual charging of the processing machines becomes problematic as the dimensions of the semiconductor wafers increase.

Particular problems arise when semiconductor manufacturing machines are to be retrofitted with SMIF technology, since subsequent constructional integration is possible only in very rare cases.

OBJECT AND SUMMARY OF THE INVENTION

Therefore, the primary object of the present invention is to couple devices required for the use of SMIF technology with semiconductor processing machines in which subsequent integration of SMIF technology is not possible, wherein the charging to be carried out after coupling is highly flexible and capable of managing increasing dimensions of semiconductor wafers.

This object is met in a device for coupling loading and unloading devices with semiconductor processing machines in that an adjustable receiving element for the loading and unloading device is provided inside a movable enclosure, this receiving element being displaceable between at least two planes situated one above the other, one plane serving for charging the loading and unloading device and every other plane being used for the charging of the semiconductor machine carried out by the loading and unloading device, and in that the enclosure has aligning and holding elements for fastening to a coupling element which is aligned with the semiconductor processing machine.

The receiving element can be an adjustable plate connected with a lift or the adjustable plate can be supported by a horizontally movable element attached to the lift.

The advantage of a horizontally displaceable receiving element consists in that all processing locations in a semiconductor processing machine can be serviced by one loading and unloading device. No floor space is needed for additional loading devices.

The enclosure which forms a mini-clean room and ensures a horizontal flow of air (primary air) through the magazine with reduced turbulence in every phase of charging the semiconductor machine while allowing for the various charging methods includes a stationary outer part and an extendable inner part which encloses the receiving element together with the loading and unloading device. For the purpose of displacing the receiving element between the planes located one above the other, the inner part can be moved in and out in a telescoping manner together with the receiving element and the loading and unloading device.

At least one closing element is advantageously provided at the telescoping inner part of the enclosure in order to close the charging openings in the semiconductor processing machine. The two parts of the enclosure have bore holes in their side remote of the semiconductor processing machine so that the suction process or ventilating process is also ensured when the inner part penetrates into the outer part. Further, the inner part has holes in its base to promote the flow of air.

The coupling element is advantageously a bottom plate which is adjustable relative to the semiconductor processing machine and has a beveled front edge in which semispherical-cap supporting screws are deposited in shaped members for the purpose of a positive-locking orientation in accordance with coordinates.

A permanent magnet with reversible force is arranged at the stationary part of the enclosure for fastening purposes.

A loading and unloading device which is adjustable in conformity to coordinates relative to a semiconductor processing machine can be constructed with a solution of this type, according to the invention, comprising a movable device. The device is coupled with the loading and unloading device in a stable manner and so as to be uncoupled from the vibrations of the semiconductor processing machine to a great extent.

The device can be moved away from the semiconductor processing machine quickly and in an uncomplicated manner for servicing and can be moved back together with it in a reproducible manner.

Further, this solution does not require any alignment or adjustment points or locking devices at the semiconductor processing machine.

No obstacles are created by elements extending beyond the projected surface of the charging robot so that a very close arrangement of two devices according to the invention adjacent to one another and to the semiconductor processing machine is ensured.

In step with technical processes, it is increasingly necessary to use magazines for semiconductor wafers diverging from the norm with respect to connection dimensions, magnitude, wafer capacity or material. Accordingly, a continuous outfitting of semiconductor plants to conform to SMIF standards results in restrictions or disruptions in the normal production flow.

For this reason, the present invention provides a solution in which a plate part which can be lowered in the interior of the loading and unloading device can receive not only a transport container for a magazine as charging object but also the magazine itself as charging object.

For this purpose, an adapter on which the magazine can be deposited is connected with the plate part and functions as the bottom of the SMIF box. The adapter has at least one guide on a base plate, this guide having guide edges which are directed parallel to one another, between which guide edges the magazine is deposited by a crosspiece connecting opposite walls of the magazine. A pair of lowerable elements which are guided through the base plate transmits a simultaneous actuation to sensors in the plate part through the magazine walls in the deposited state of the magazine via connection members.

By means of this solution, magazines can be transported with a loading and unloading device designed exclusively for SMIF technology in that deposited magazines can be detected by the mechanical detection and transmission system via the detector system normally located in the plate part (SMIF port).

For purposes of safety in the device, the lift for the receiving element is driven by a stepper motor connected with a voltage-dependent motor brake. Moreover, pneumatic springs support the lift relative to the stationary part.

In addition, the stationary part supports a movable safety hoop in which objects resting on the safety hoop interrupt a normally closed circuit so that the stepper motor is switched off.

For a better understanding of the present invention, reference is made to the following description and accompanying drawings while the scope of the invention will be pointed out in the appended claims.

DESCRIPTION OF THE PREFERRED EMBODIMENTS

Figure 1:
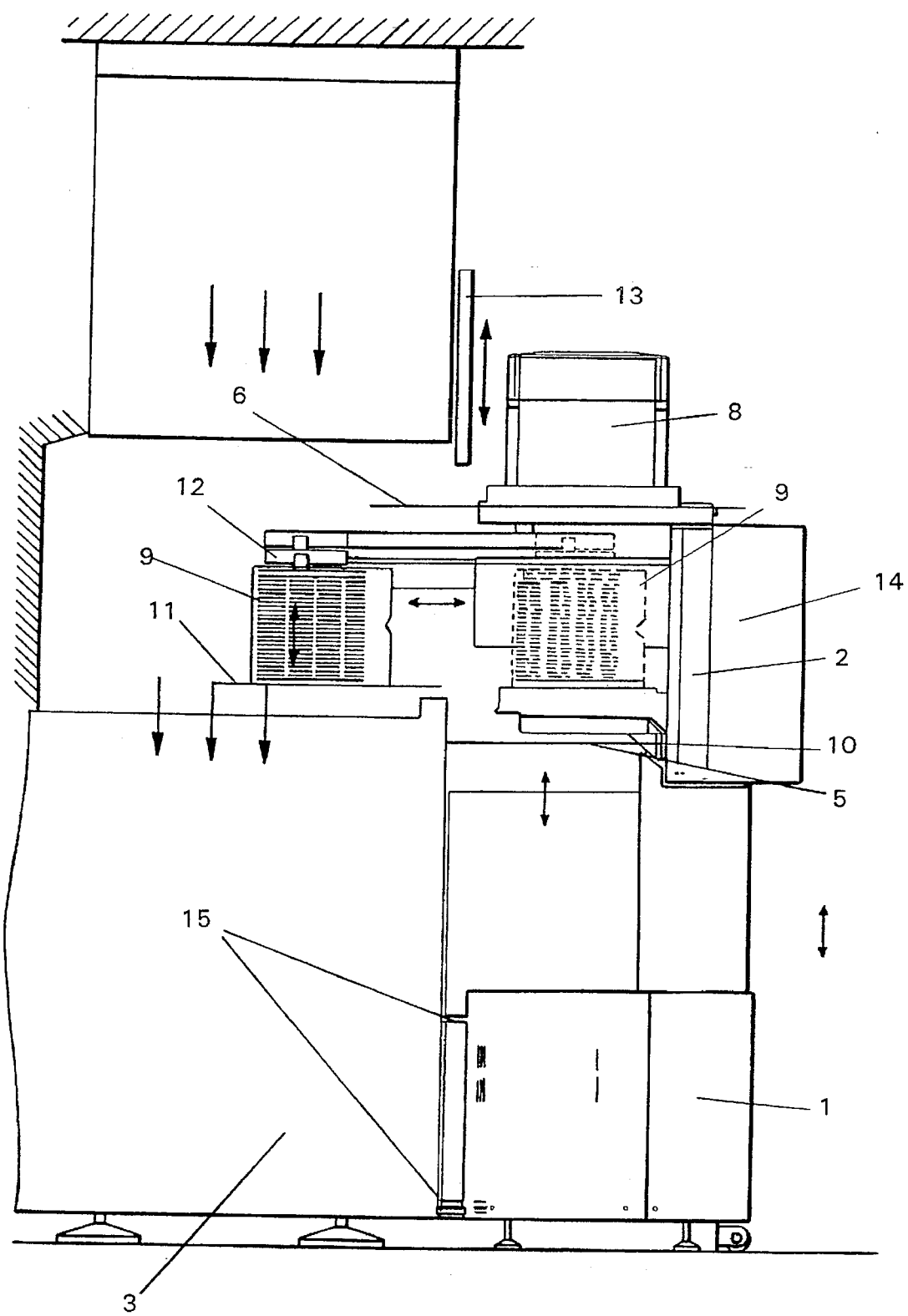
FIG. 1 shows a device coupled to a semiconductor processing machine.

A device 1 shown in FIG. 1 supports a transport device according to German Patent 43 26 309 C1 as loading and unloading device 2. Of course, instead of this arrangement, it is also possible to use devices with a different flow of operations for loading and unloading a semiconductor processing machine 3.

An adjustable base plate 4 (FIG. 2) which is movable between two planes 5, 6 located one above the other serves as a receiving element for the loading and unloading device 2. Plane 5 is situated at an ergonomically advantageous height for charging the loading and unloading device 2, in which a transport container 8 in the form of a SMIF box can be deposited, as object to be charged, on a plate part 7 serving as interface. In plane 6, which serves as charging plane, the SMIF pod is opened automatically and a magazine 9 is moved to a transfer height 11 by an elevator 10. A gripper 12 grasps the magazine 9 and transports it into the semiconductor processing machine 3 by means of a linear movement. The magazine 9 is removed from the semiconductor processing machine 3 in a corresponding manner by the reverse sequence of steps.

A closing element 13 which is coupled with the housing opens and closes the semiconductor processing machine 3. In so doing, it is ensured that the air flow inside the semiconductor processing machine 3 remains unperturbed and access for charging or taking out the magazine 9 is guaranteed.

Depending on the air flow in the semiconductor processing machine 3, an air flow generated by a filter-ventilator unit 14 can act in the direction of the semiconductor processing machine 3 or can reinforce an air flow directed out of the semiconductor processing machine 3.

The device 1 can be coupled with the semiconductor processing machine 3 by detachable coupling elements 15 or coupling can be effected in a solution corresponding to FIGS. 10 to 13.

Figure 2:
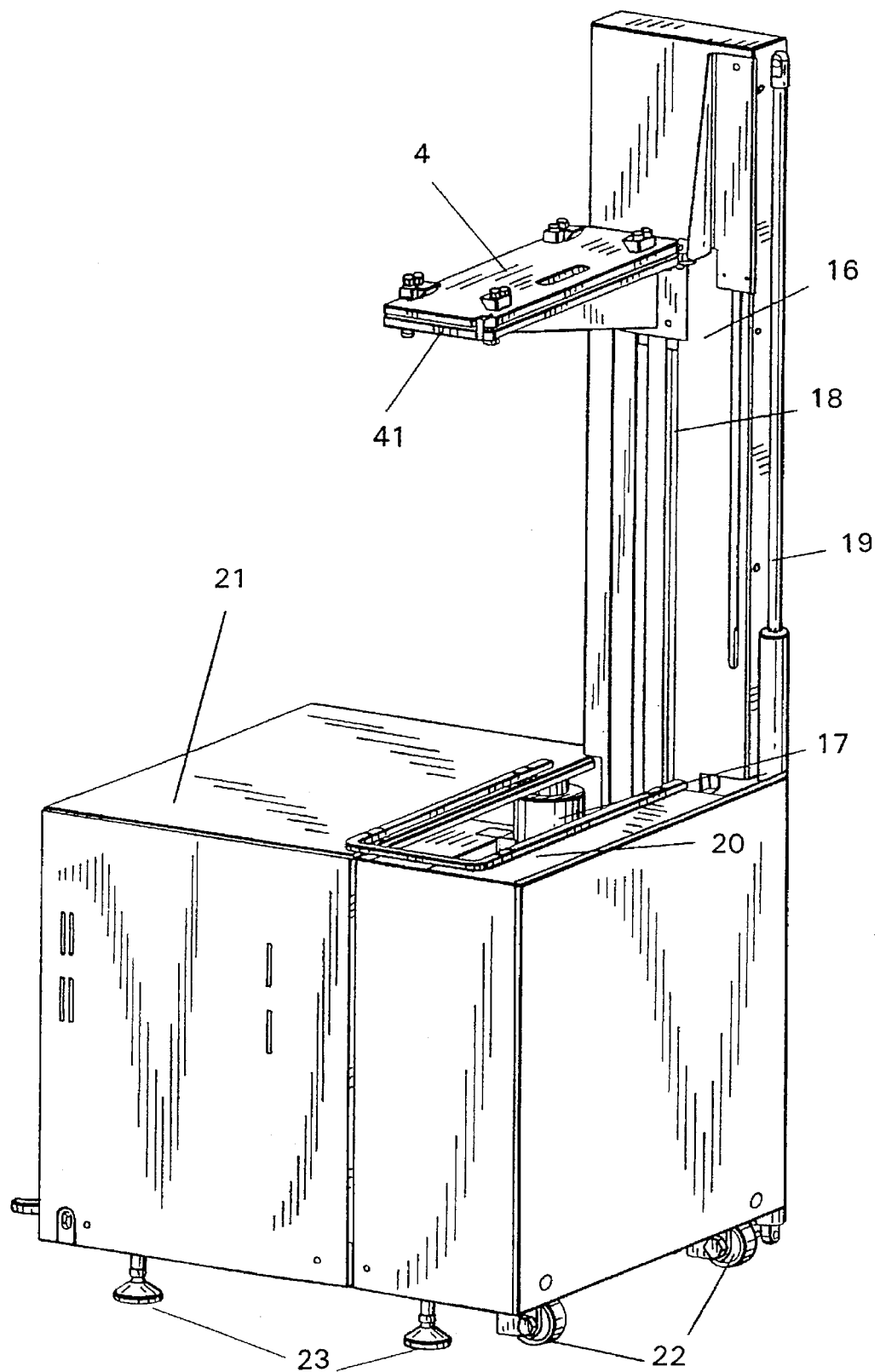
FIG. 2 shows the device without housing.

According to FIG. 2, the adjustable base plate 4 which is screwed to a fastening plate 41 is attached to a vertically movable lift 16 which is driven by an electric stepper motor 17 for traveling between two planes 5, 6 situated one above the other. The rotational movement of the stepper motor 17 is transmitted via a toothed belt, not shown, to a threaded spindle 18 and is transformed into a linear movement.

In the event of power outage or emergency shutdown, a voltage-independent motor brake directly connected with the stepper motor 17 acts via an emergency cutoff switch, not shown, to ensure active safety. In addition, two pneumatic springs 19, one of which is visible in the drawing, compensate for the mass of the structural component parts moved in the vertical direction.

A safety hoop 20 constructed according to German Patent Application 44 21 828.1 forms another measure for increasing safety, in particular for preventing injury to operators. An object present between the elevator 16 and the safety hoop 20, owing to the force acting on the safety hoop 20, causes a break in an otherwise closed circuit and consequently causes the stepper motor 17 to be switched off immediately. The lift remains in the position occupied at that instant and is held by the action of the pneumatic springs 19.

The device 1 is enclosed by a casing 21 forming a container system which also receives, among others, the control electronics which are not shown here.

With the aid of rollers 22, the entire device can be transported easily, a prerequisite for fast coupling to and uncoupling from the semiconductor processing machine. The device is set down on adjustable feet 23, or a solution according to FIG. 13 can be used.

Figure 3:
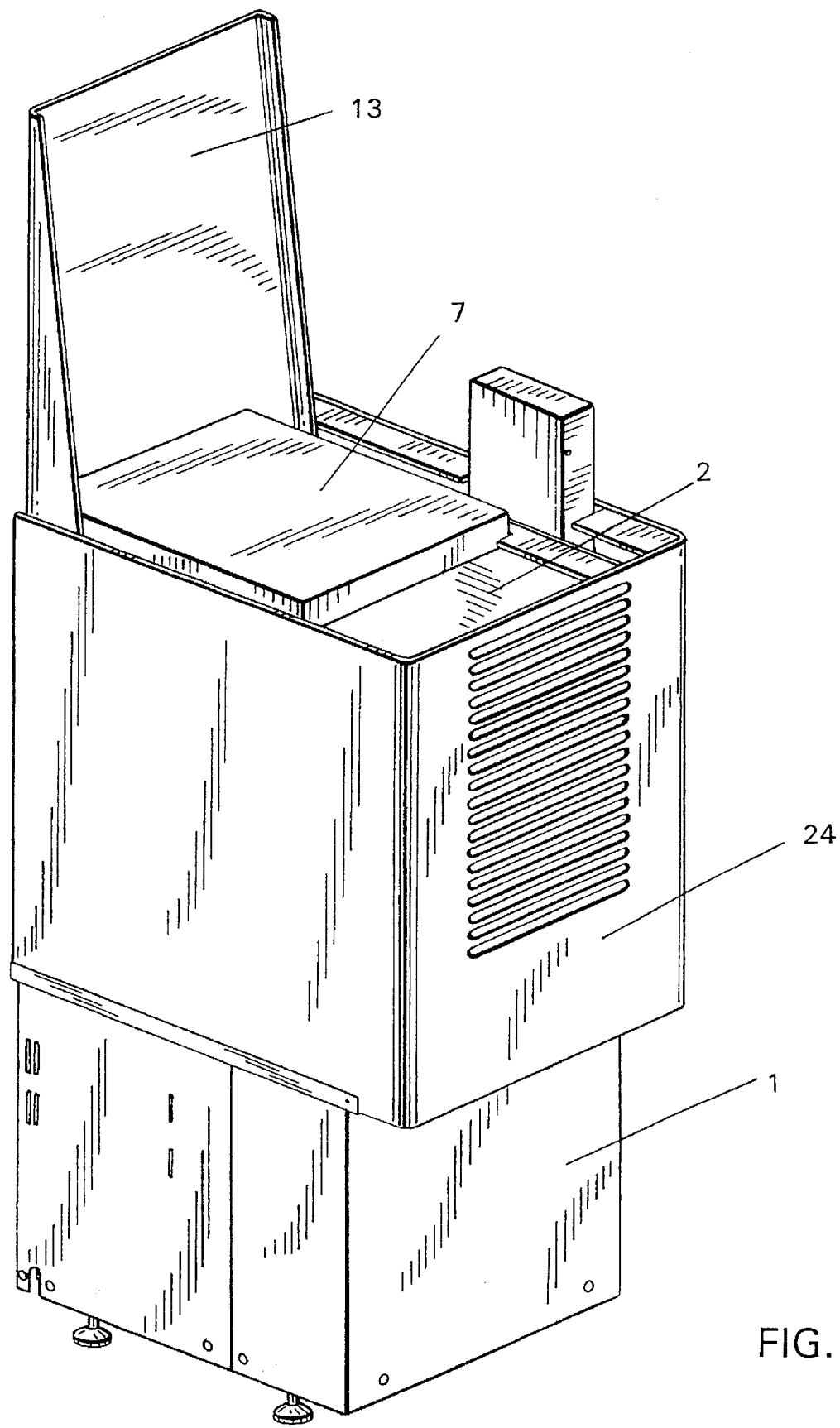
FIG. 3 shows the device in an adjustment for ergonomic charging of a loading and unloading device.

In the enclosed state shown in FIG. 3, in which the plate part 7 is located in the plane 6 serving as charging plane, the entire device is enclosed so as to ensure clean room conditions in the interior.

Figure 4:
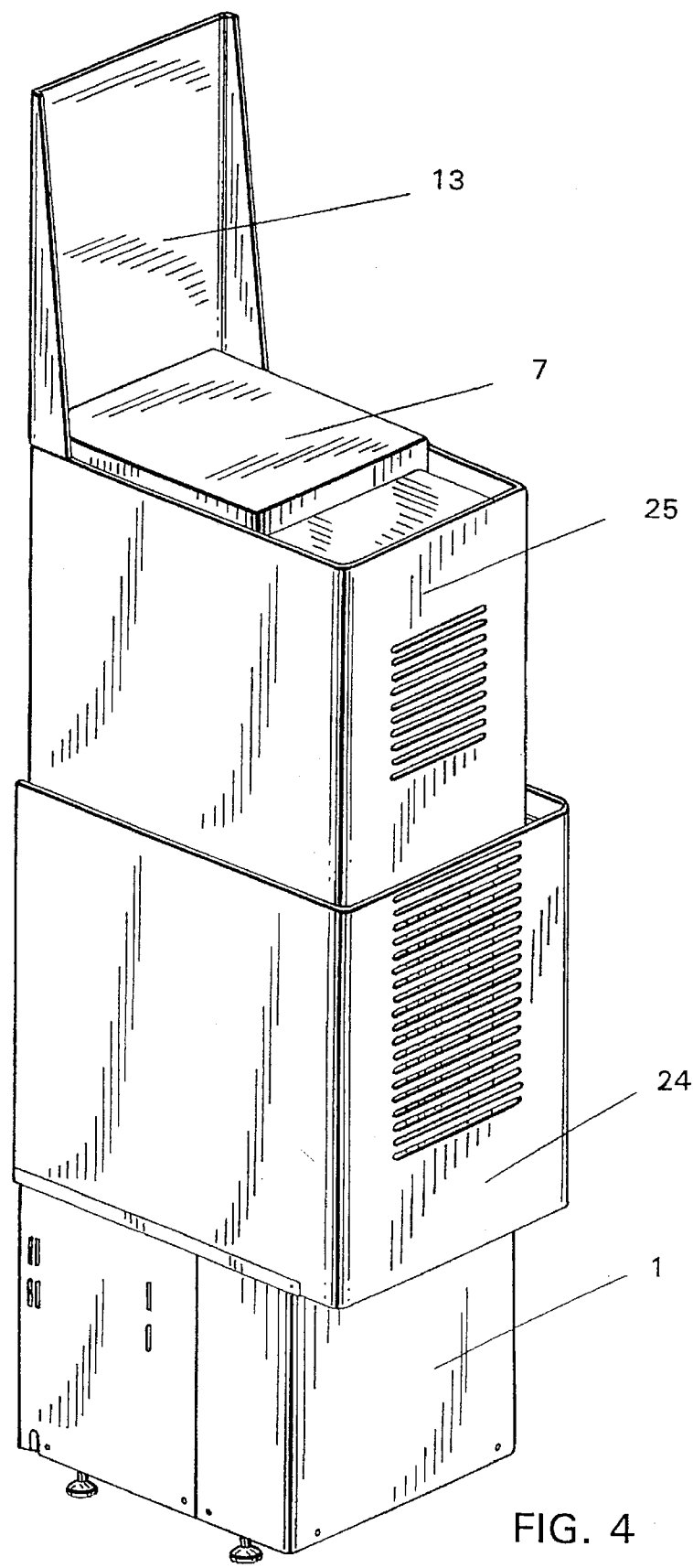
FIG. 4 shows the device in an adjustment for charging a semiconductor processing machine.

As will be seen from FIG. 4, the enclosure is formed by a stationary outer part, housing 24, and an inner part, housing 25, which encloses the receiving element and the loading and unloading device 2 and can be moved out in a telescoping manner in order to charge the semiconductor processing machine 3. This housing design ensures the required clean room conditions during charging or in retrofitting the semiconductor processing machine with SMIF technology.

Figure 5:
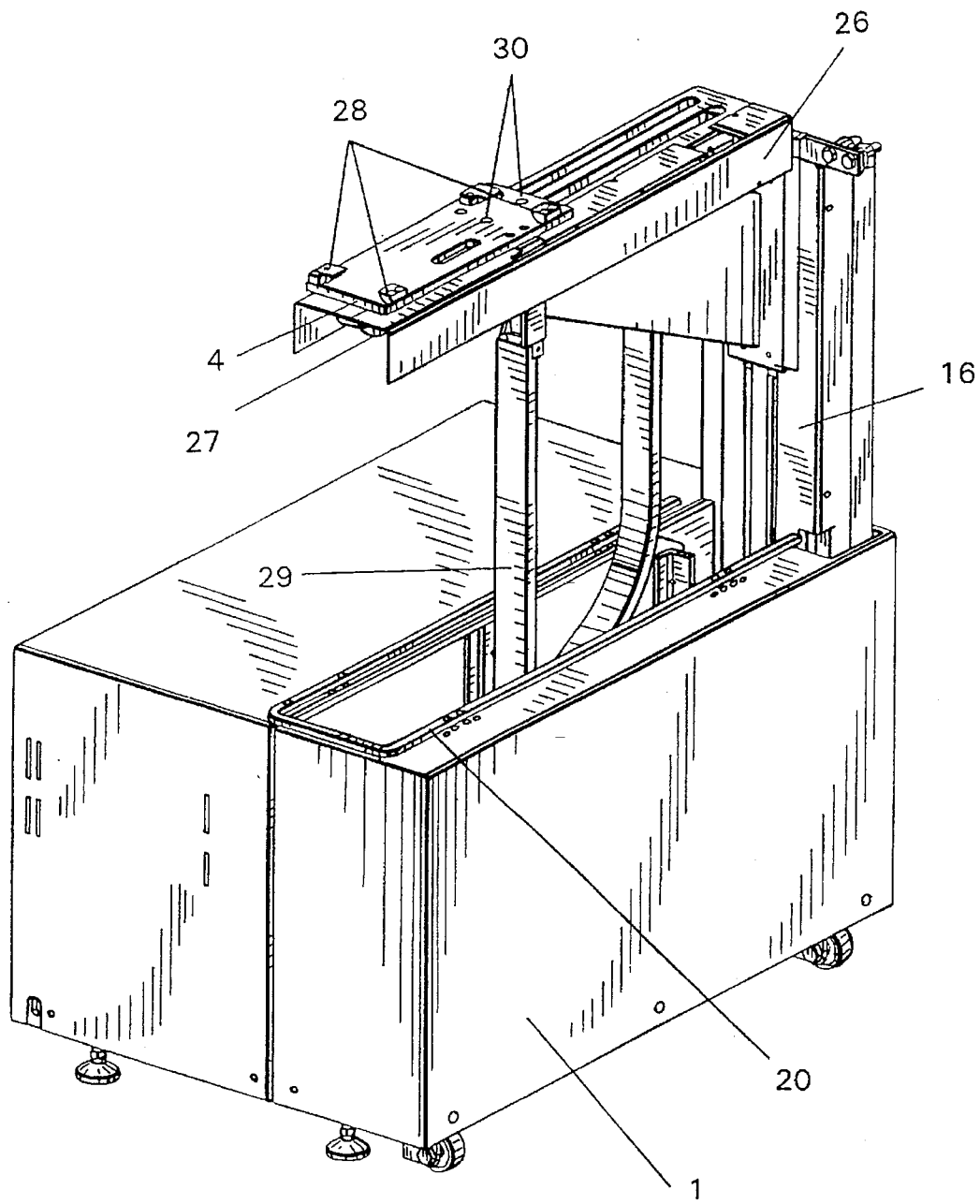
FIG. 5 show a device with expanded lateral charging region.
Figure 6:
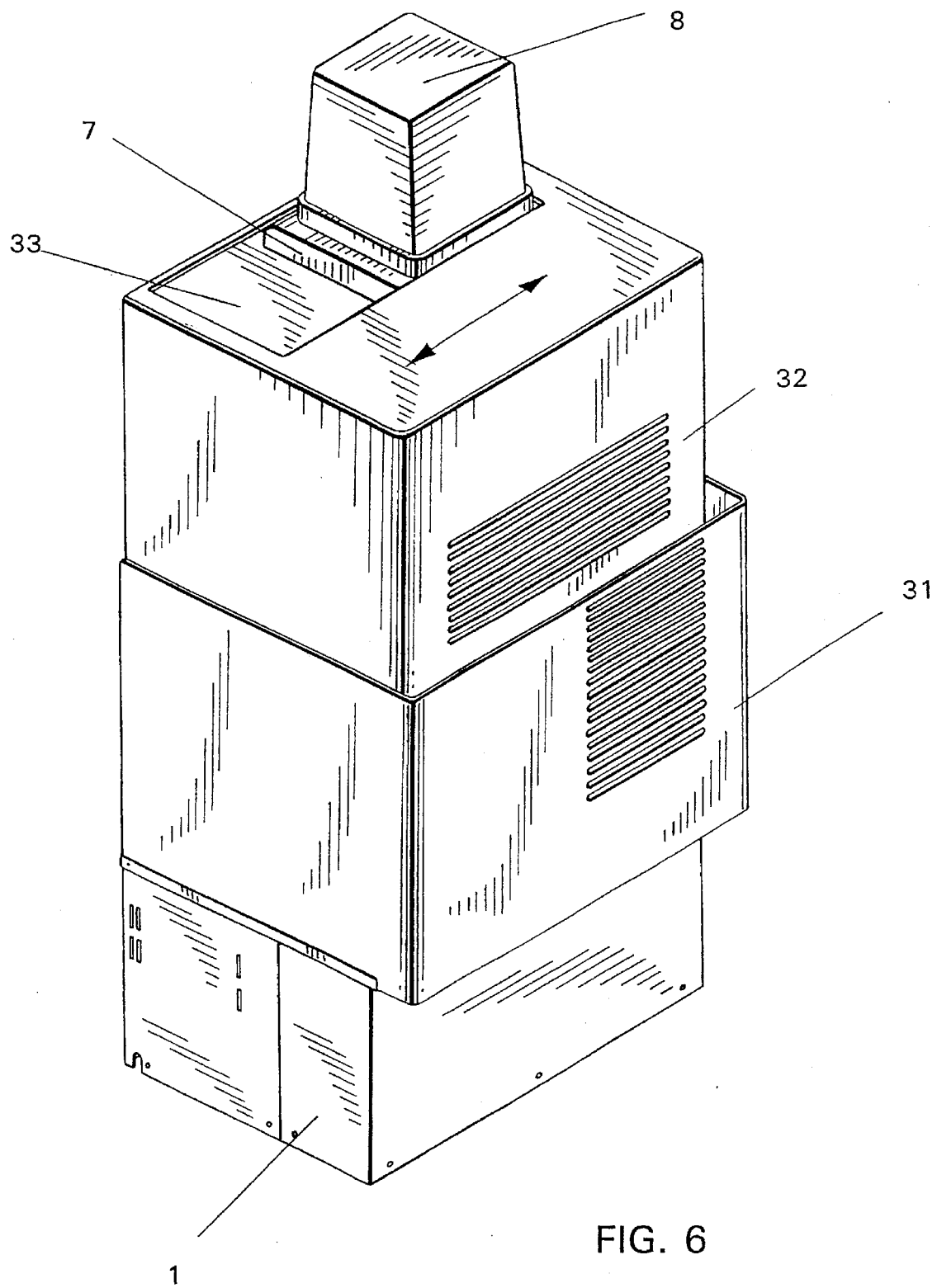
FIG. 6 shows the device according to FIG. 5 with enclosure.

The range of movement of the device 1 can be expanded by means of a solution according to FIGS. 5 and 6 in which other processing locations located adjacent to one another can be serviced in addition to planes 5, 6 which are located one above the other.

Instead of the adjustable base plate 4 for receiving the loading and unloading device 2, a unit 26 capable of executing a linear movement in the horizontal direction is arranged on the fastening plate 41 shown in FIG. 2. The adjustable base plate 4 is fastened to this unit 26 by means of corresponding mechanical fastening elements (not shown). The unit 26 is formed by a U-shaped base body for holding a stepper motor 27 with spindle drive, not shown, and a guide coupled thereto. The stepper motor 27 is monitored for each step via an encoder and is monitored in both end positions by electronic end position couplers. The loading and unloading device 2 to be placed on, which is held by fastening elements 28, is connected with the electronic control unit by a trailing cable 29.

The loading and unloading device 2 can be changed quickly in a mechanical construction of the adjustable base plate 4 with a place-finding or relocating device 30.

In the view shown in FIG. 6, the construction according to FIG. 5 is enclosed by housings 31, 32, corresponding in principle to the enclosure shown in FIG. 4. The housing 32 is moved relative to housing 31 in a telescoping manner for adjusting height. A movable closing element 33, e.g., a door, sliding flap or roll-type shutter, ensures that the inner clean room of the loading and unloading device 2 also remains closed during lateral movement.

Figure 7:
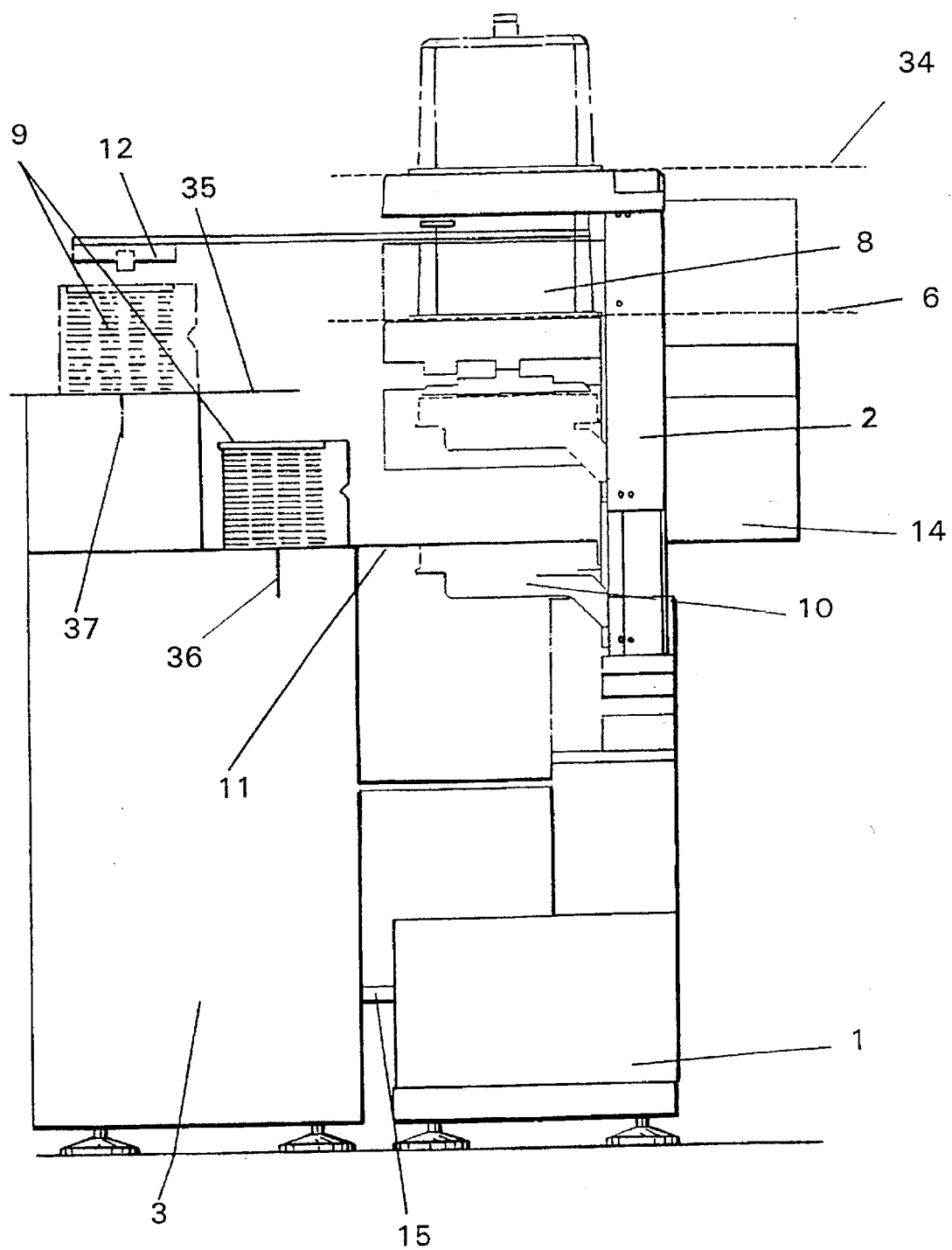
FIG. 7 shows a device for two different charging planes.

Further, the solution according to the invention makes it possible, by means of vertical adjustment of the receiving plate 4, to move toward other planes in addition to planes 5, 6 which, as shown in FIG. 1, are located one above the other. FIG. 7 shows an example in which the semiconductor processing machine 3 can be charged in an additional plane 34. The magazine 9 can be transported into the semiconductor processing machine 3 from plane 6 to transfer height 11 and from plane 34 to another transfer height 35.

Moreover, with the loading and unloading device 2 it is possible to deposit the magazine 9 in various positions 36, 37 proceeding from planes 6 and 34 or in other positions when using devices with an operating flow other than that corresponding to the transport device according to German Patent 43 26 309 C1.

The enclosure for the loading and unloading devices 2 is described in more detail with reference to FIGS. 8 to 11. These loading and unloading devices 2 have a filter-blower/ventilator unit 14 integrated in their rear wall remote of the semiconductor processing machine 3 and, as was already mentioned, can be adjusted vertically and/or displaced transversely to the semiconductor processing machine 3, these loading and unloading devices 2 being mechanically connected in a stationary manner via an adjustable base plate 4.

Figure 8:
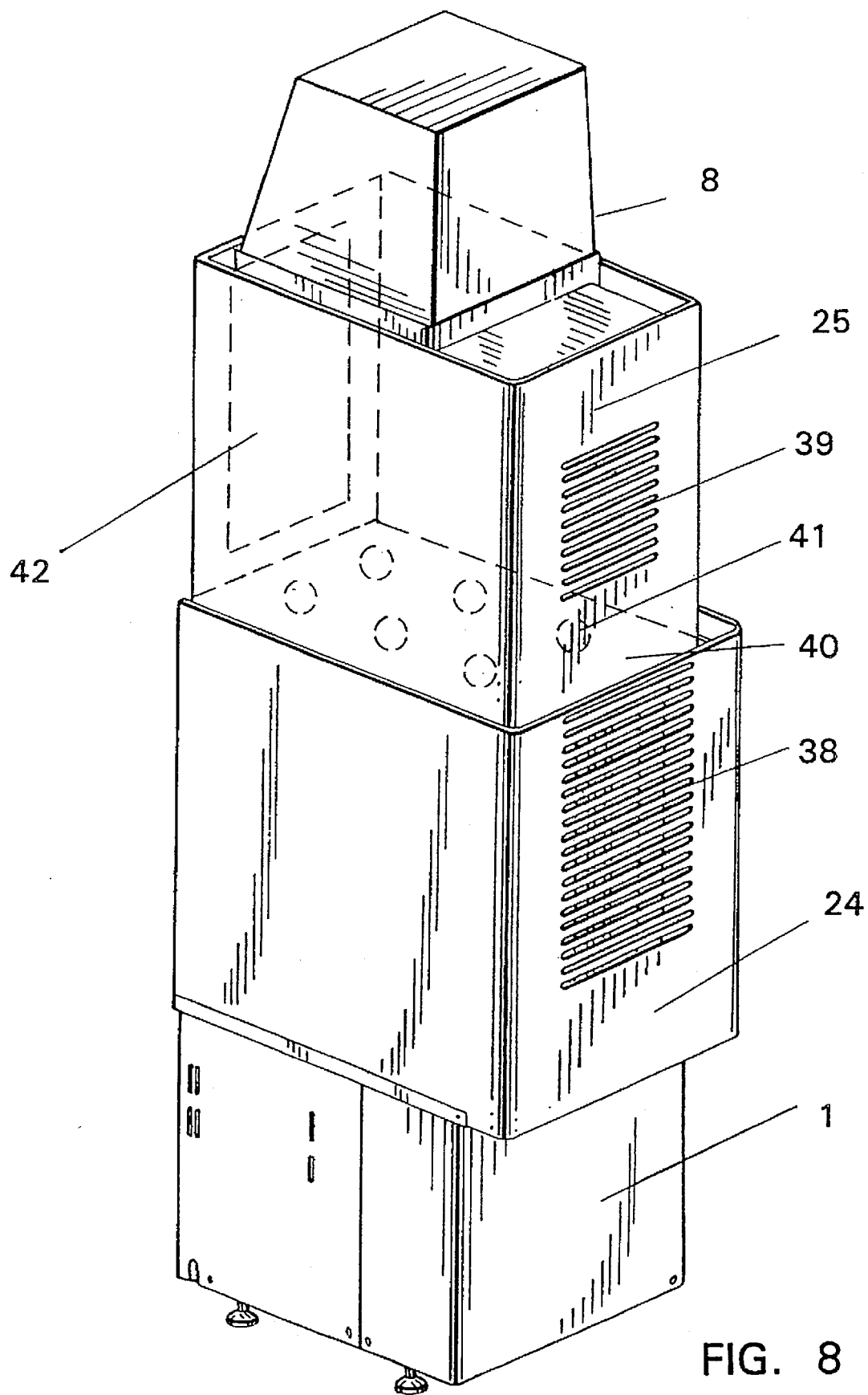
FIG. 8 shows an enclosure for charging semiconductor processing machines with closable charging opening.

As is already known from FIG. 4, the enclosure shown in FIG. 8 has the stationary housing 24 in which the vertically adjustable housing 25 of the loading and unloading device is integrated. The housing 25 is preferably formed by four plastic plates which are anti-static and thus conform to clean room requirements, these plates being mounted in a stationary manner at two side walls and at the upper and lower sides of the loading and unloading device 2. An enclosure of this kind is suitable for single-tier charging of semiconductor processing machines with self-closing charging opening.

The two housings 24, 25 are completely open at their front side facing the semiconductor processing machine 3. Due to the relocating device which will be described more fully with reference to the drawings, the distance between all adjacent wall parts vertical to the semiconductor processing machine 3 is to be produced in such a way that mechanical contact is ruled out during vertical displacement but clean room conditions remain intact.

The two housings have bore holes 38, 39 in their rear walls to ensure the suction process or ventilation process also when the vertically displaceable housing 25 penetrates into the stationary housing 24.

The housing 25 is closed at the bottom by a bottom plate 40 having holes 41 for the purpose of reducing a vertical flow with a throttling action/nozzle action along the front side of the semiconductor processing machine 3 when the vertically displaceable housing 25 penetrates into or is moved out of the stationary housing 24 and so as to ensure overpressure or a pressure difference in the mini-clean room relative to the outside atmosphere or semiconductor processing machine 3.

Further, means, not shown, are provided for automatically switching off or switching on the filter-blower/ventilator unit 14 during movement into or out of plane 5 in which the loading and unloading device 2 is charged with a SMIF box.

Figure 9:
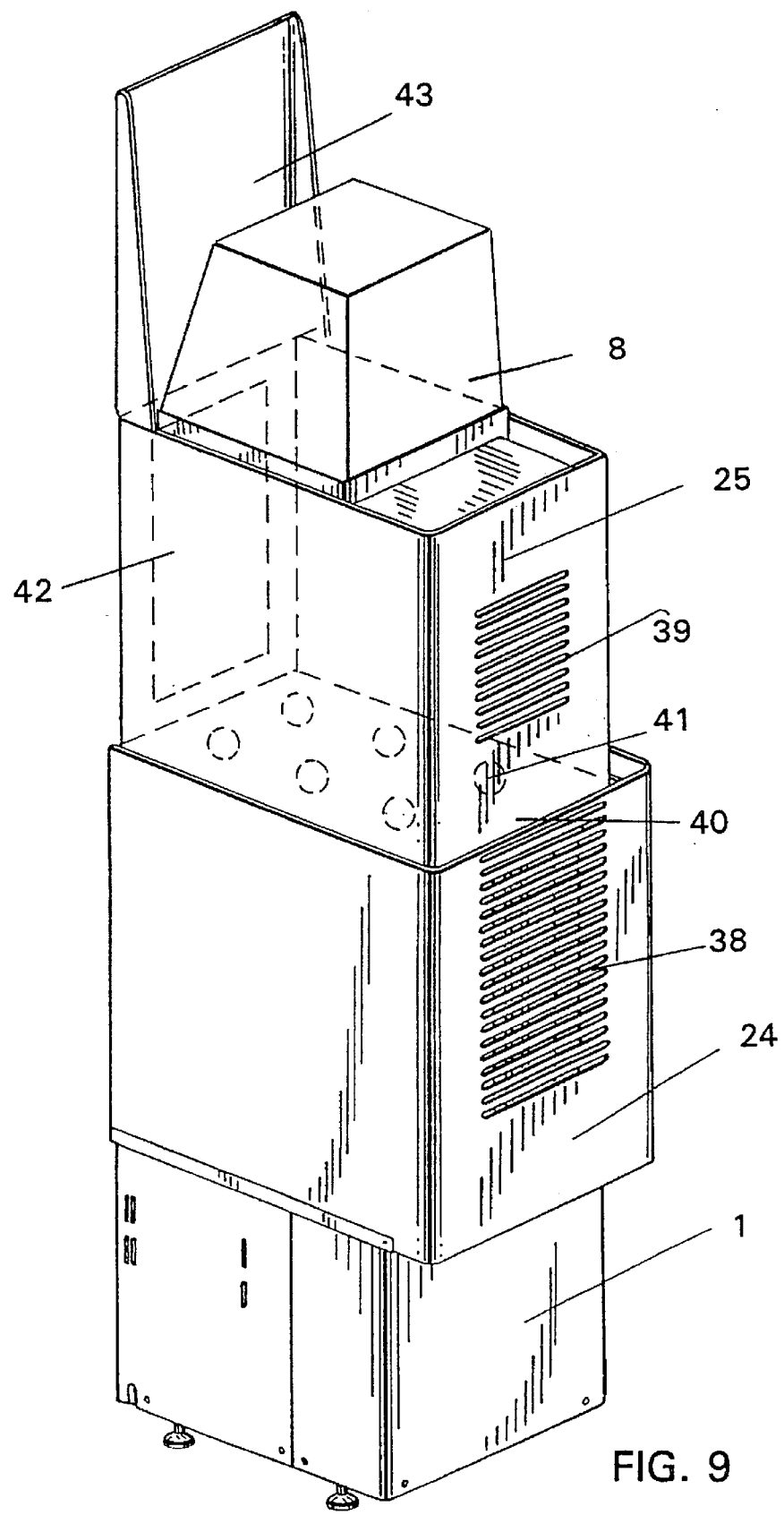
FIG. 9 shows an enclosure for charging semiconductor processing machines without closure of the charging opening.

According to FIG. 9, a shield 43 which extends parallel to the front wall of the semiconductor processing machine 3 and closes the charging opening 42 during movement of the loading and unloading device 2 in plane 5 is provided in addition for single-tier charging of semiconductor processing machines 3 which do not have a closure for a charging opening 42.

Figure 10:
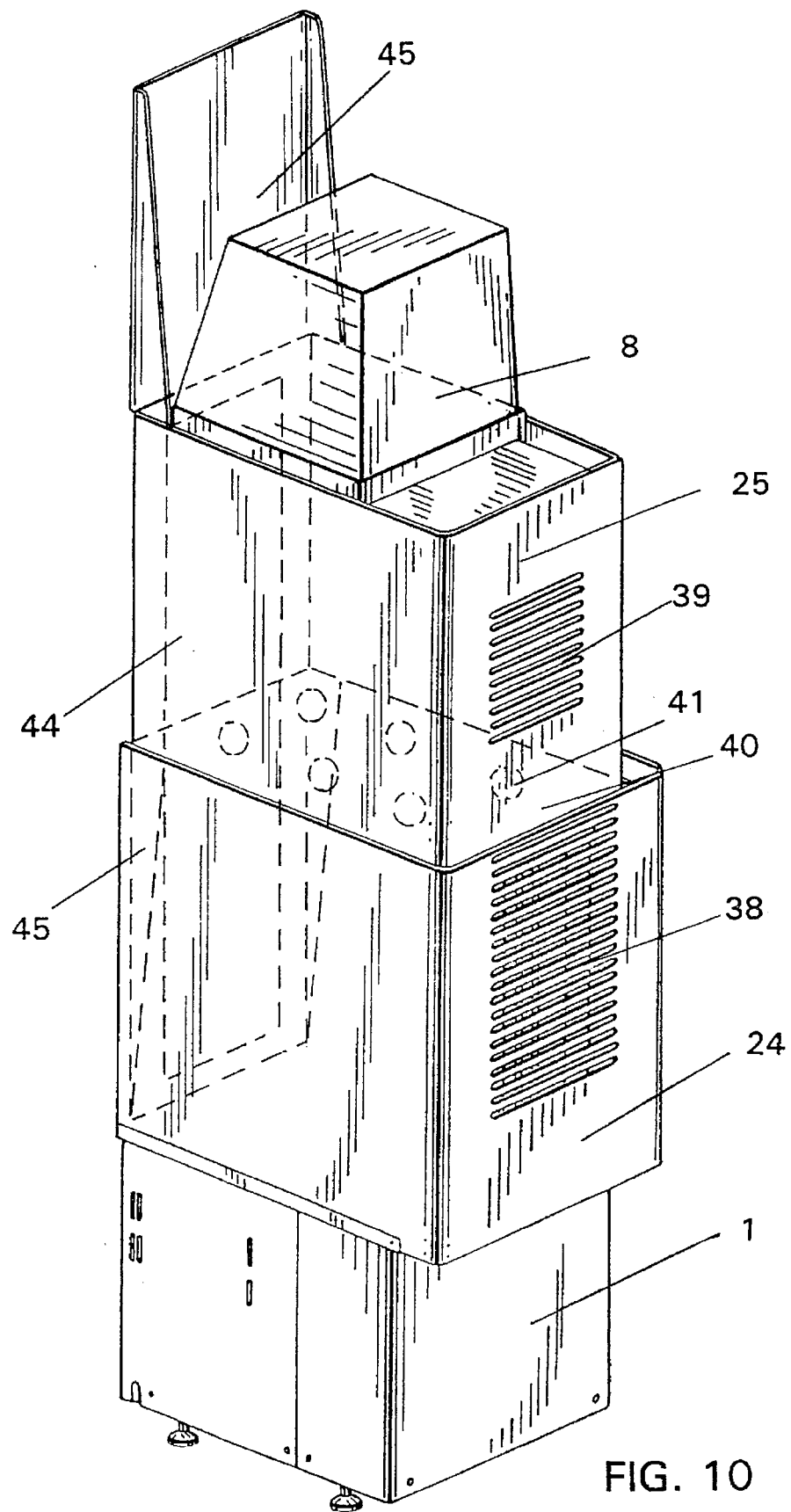
FIG. 10 shows an enclosure for a two-tier charging of semiconductor processing machines without closure of the charging opening.

In addition to the solution according to FIG. 9, two shields 45 extending parallel to the front wall of the semiconductor processing machine 3 are connected with the housing 25 in a stationary manner in FIG. 10 for two-tier charging of semiconductor processing machines not having a closure for a charging opening 44. The construction serves for charging parallel to the front wall of the semiconductor processing machine 3 in two different planes located one above the other as shown in FIG. 7. The shields 45 are so constructed that the part of the opening 44 of the semiconductor processing machine not charged is always closed.

Figure 11:
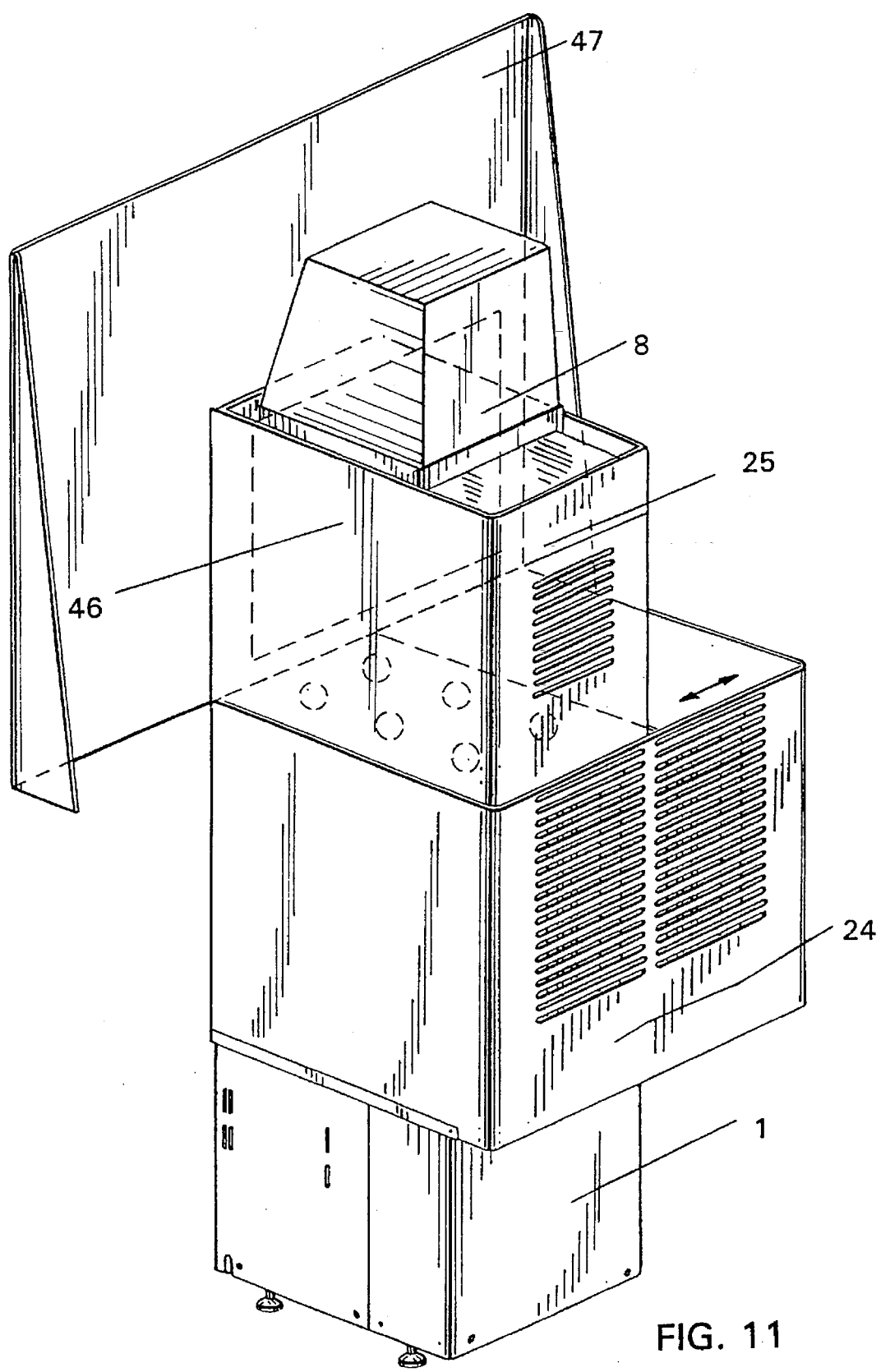
FIG. 11 shows an enclosure for single-tier charging of two or more adjacent charging or take-out stations without closure of the charging opening.

Finally, for single-tier charging in two or more adjacent loading or unloading stations in a semiconductor processing machine 3 not having any closure for a charging opening 46, a shield 47, according to FIG. 11, is fastened in a stationary manner to housing 25 and parallel to the front wall of the semiconductor processing machine 3. During movement of the loading and unloading device 2 in plane 5, this shield 47 always closes the portion of the charging opening 46 not being charged.

Instead of the shield connected with the loading and unloading device 2 in a stationary manner for closing the charging openings, movable covers such as roller shutters corresponding to clean room requirements can also be used. Solutions providing sliding doors in the semiconductor processing machine which are coupled with the movement of the loading and unloading device can also be used.

Figure 12:
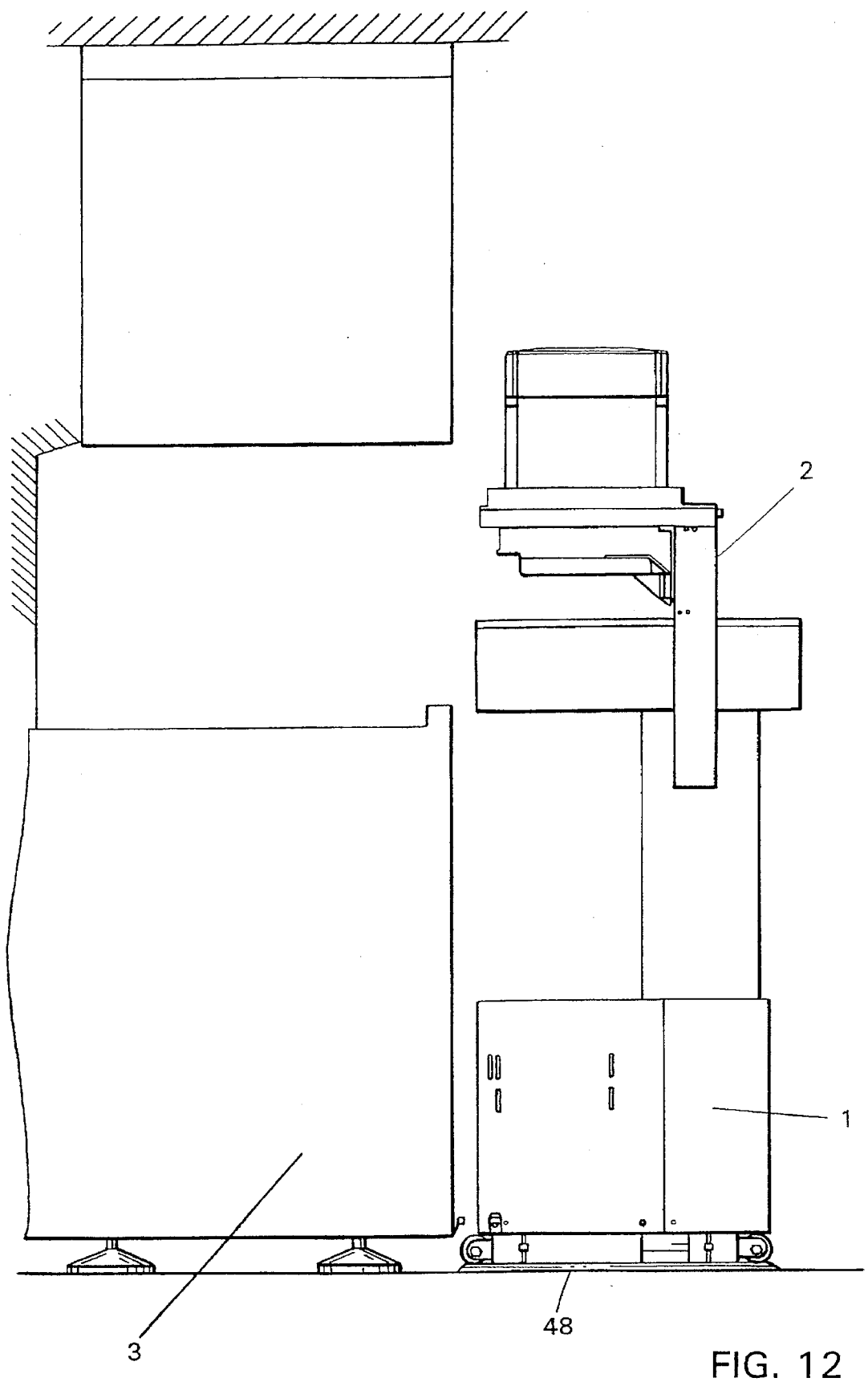
FIG. 12 shows the device deposited on a base plate adjusted with respect to the semiconductor processing machine.

According to FIG. 12, a flat bottom plate 48 which holds the device 1 with loading and unloading device 2, serves as a coupling member and is adjusted relative to the semiconductor processing machine 3 is connected by screws to the floor in front of the semiconductor processing machine 3. Elements suitable for relocating the aligned position for the device in a reproducible, positive-locking manner are located in the bottom plate 48. The device 1 can be advanced or withdrawn together with the loading and unloading device 2 in the tilted state on rollers 49 in the manner of a hand truck.

Figure 13:
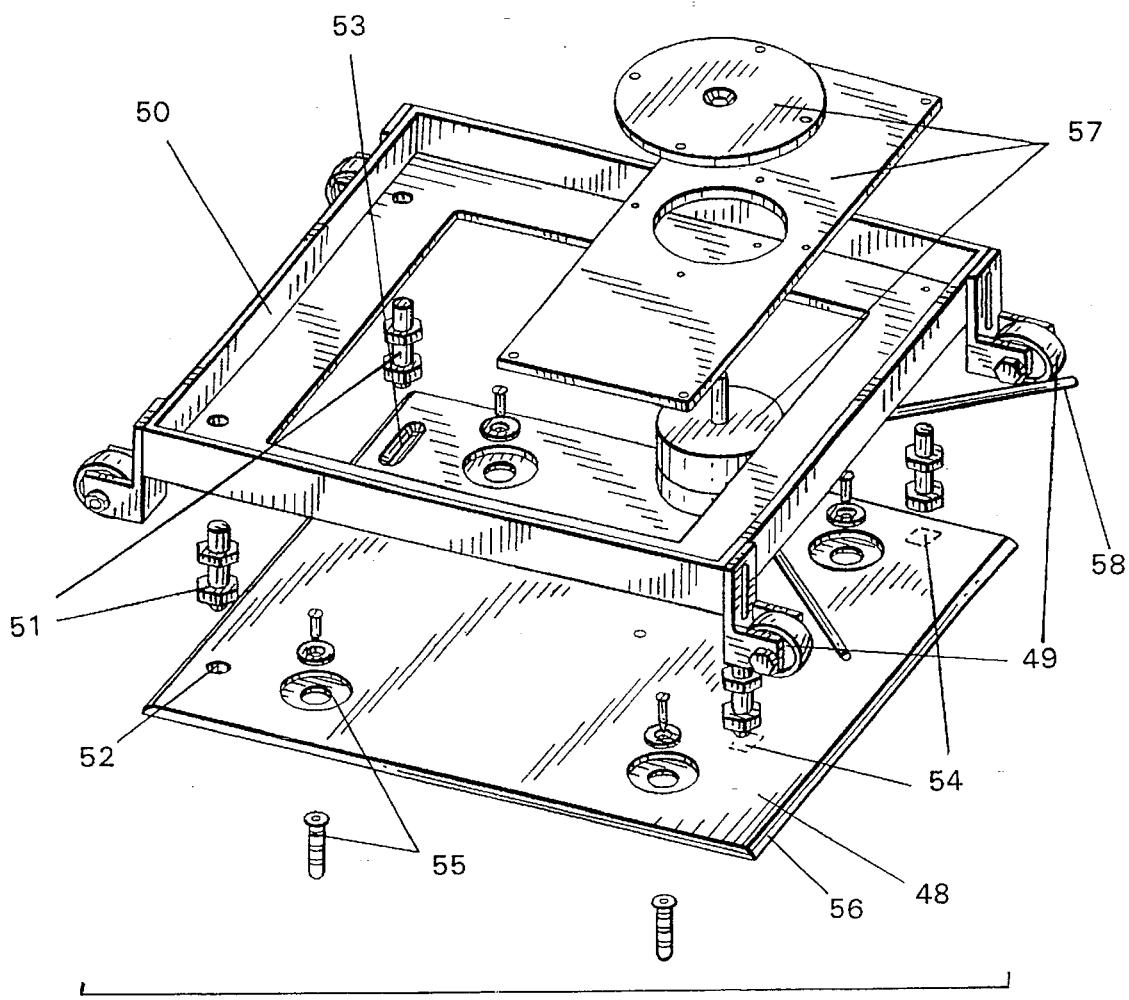
FIG. 13 shows means for aligned and stable fastening of the device relative to the semiconductor processing machine.

According to FIG. 13, semispherical-cap supporting screws 51 are adjustable in the vertical direction for coupling in a base frame 50 in the region of the base of the device 1. These semispherical-cap supporting screws 51 are placed in the elements located in the bottom plate 48, namely, the cone 52, prism 53 and plane 54, for a positive locking orientation in conformity to coordinates. The bottom plate 48 is screwed to the floor via screws 55 in conformity to coordinates with respect to the semiconductor processing machine 3.

The front edge 56 of the bottom plate 48 is constructed in such a way that it serves as a pre-orientation (estimate) for running up the rollers 49 and the device is lowered proceeding from this location after it has been moved up in the manner of a hand truck. The supporting screws 51 locate the shaped elements 52, 53 and 54 of the bottom plate 48 automatically.

The static stability of the device 1 is preferably achieved by means of an adjustable permanent magnet 57 which is fastened to the base frame 50 cardanically or by gimbals. In the operating position of the device 1, the permanent magnet 57 is switched to maximum holding power externally via an adjusting lever 58. In this way, a frictional engagement with the bottom plate 48 is ensured along with high stability.

Depending on the dimensions of the semiconductor wafer used, the adapters shown in FIGS. 14 to 17 are suitable for attachment to the plate part 7 and to directly receive a magazine 9 as object to be charged.

Figure 14:
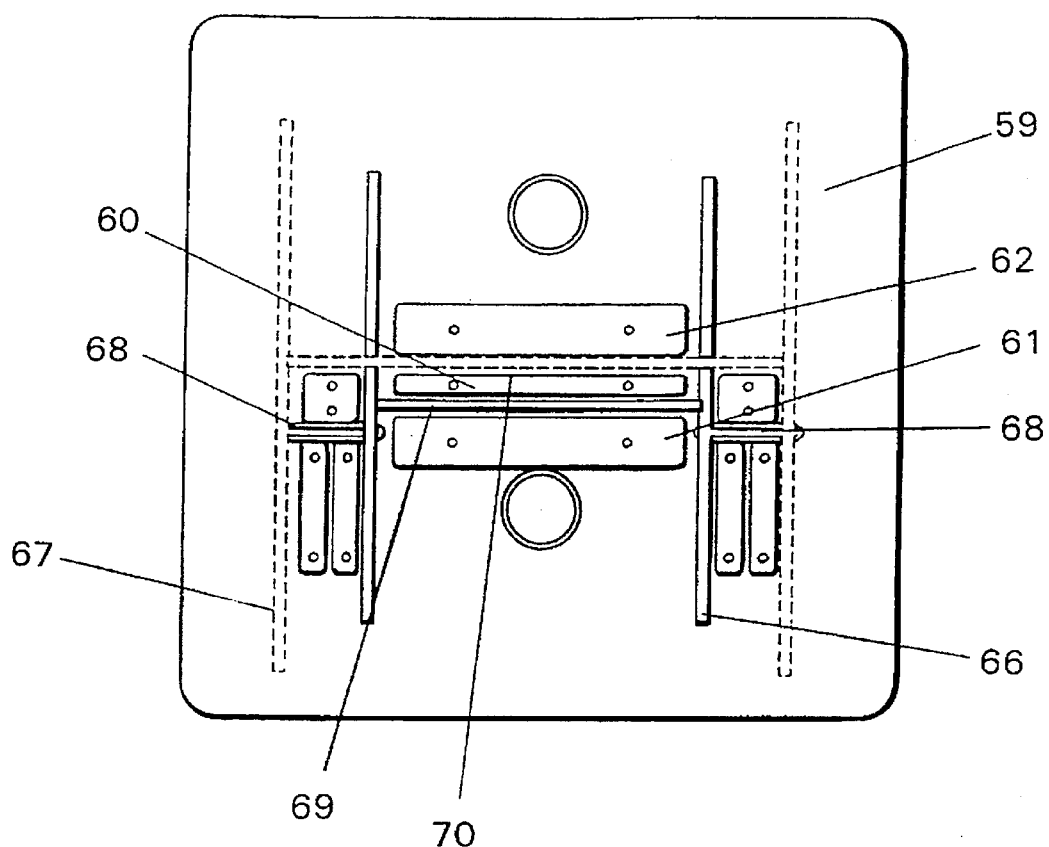
FIG. 14 shows a plan view of a first adapter for separate insertion of a magazine without transport container in the loading and unloading device.
Figure 15:
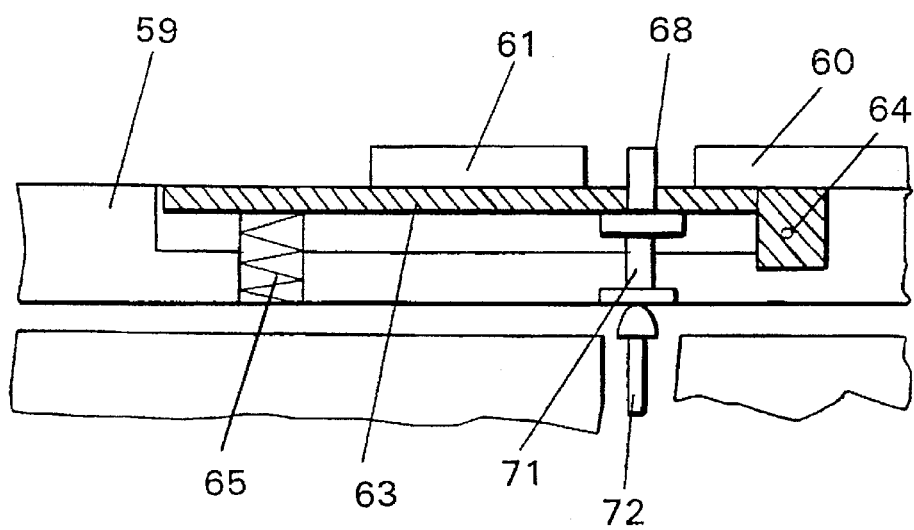
FIG. 15 shows the first adapter in cross section.

According to FIGS. 14 and 15, a contact rail 61 for 4"-magazines and a contact rail 62 for 6"-magazines are located on a base plate 59 adjacent to a guide rail 60, this base plate 7 corresponding to the dimensions of the plate part 7 in length, width and height. An angle 63 which is arranged below the base plate 59 and supported via an articulation 64 at one side and by a spring 65 is actuated by lateral magazine walls 66 or 67 of deposited magazines via a lowerable element 68 which is guided through the base plate 59. Magazine wall 66 is associated with a magazine of smaller dimensions (4") and magazine wall 67 is associated with a magazine of larger dimensions (6"). In both magazines, the magazine walls 66, 67 are connected, according to the SEMI standard, by connecting crosspieces 69, 70, a so-called H-bar. The connection crosspieces 69, 70 are the elements of the magazine serving to fasten it to the base plate 59. Sensors 72 which can also be constructed as switches are actuated in the plate part 7 via an anvil 71 by actuating the angle 63. Among other functions, the sensors 72 serve to signal the attached state. The arrangement of such sensors is shown, for instance, in German Patent 43 26 308 C1, in which they have the additional function of initiating supply and discharge of gas.

The spring 65 prevents actuation of the sensors 72 in the plate part 7 in the unloaded state. The spring 65 is so dimensioned that a full or empty magazine reliably actuates the sensors 72. Two support surfaces 68 must be actuated at the same time for reliable detection of the deposited state.

Figure 16:
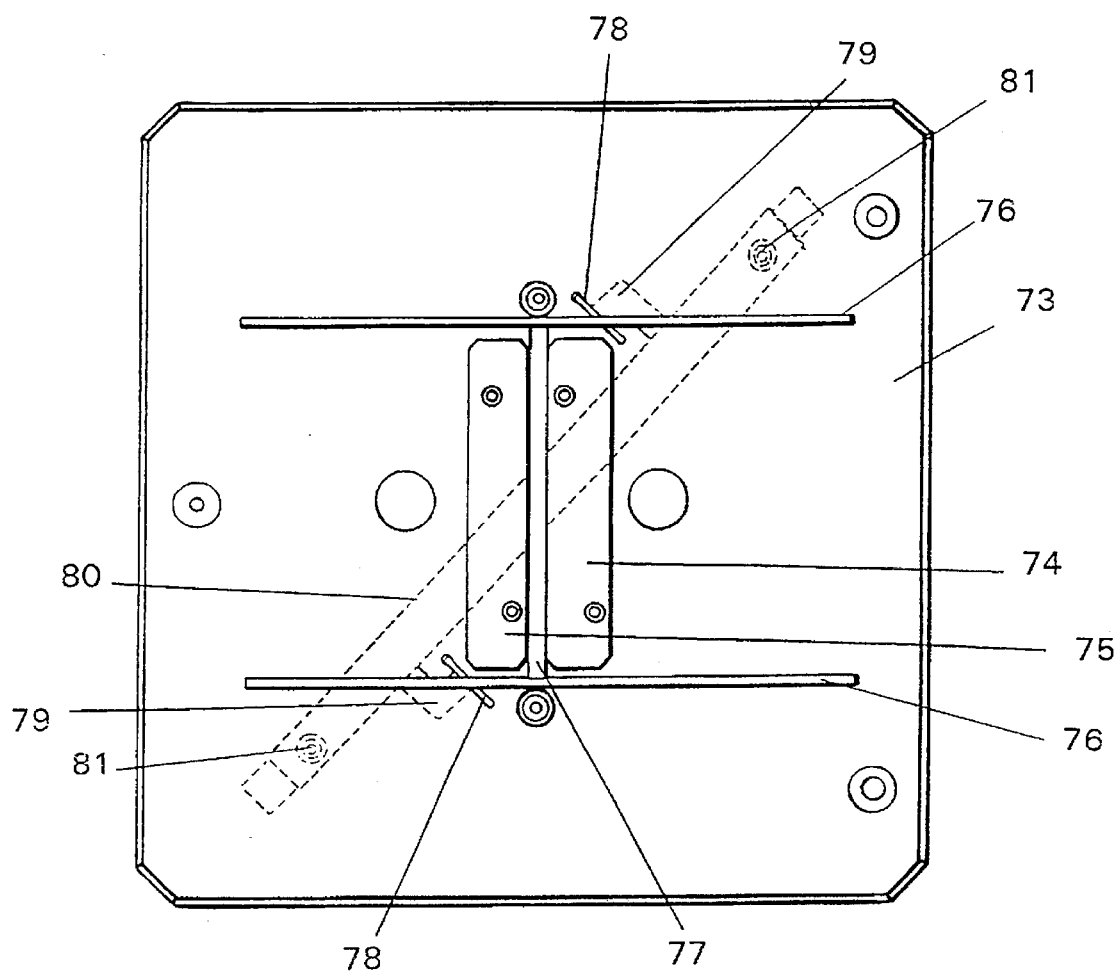
FIG. 16 shows a plan view of a second adapter.
Figure 17:
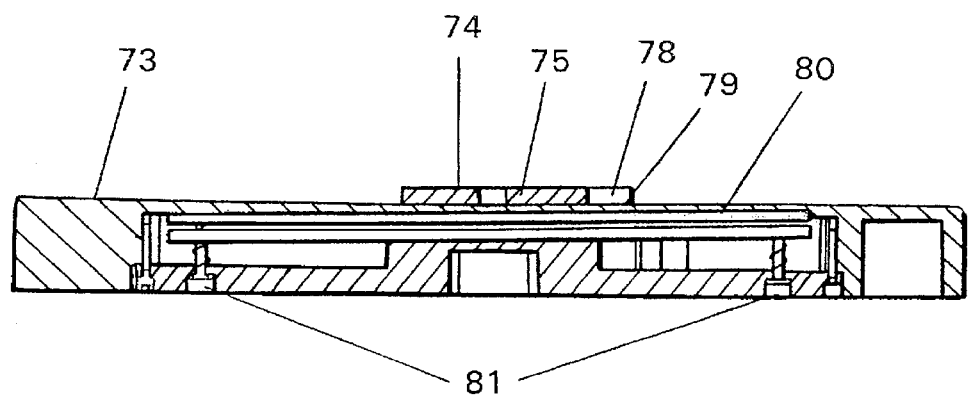
FIG. 17 shows the second adapter in cross section.

A construction of the adapter according to FIGS. 16 and 17 is provided for magazines having still greater dimensions (8"). A guide rail 74 and a contact rail 75 are arranged on a base plate 73. At the same time, lowerable elements 78 which are guided through a base plate 73 are actuated at the same time by the side walls 76 of a magazine deposited between the guide rail 74 and the contact rail 75 with its crosspiece 77 connecting the side walls 76. As in FIG. 14, the magazine is not shown in its entirety for the sake of simplicity. The support surfaces 78 are connected with a movable strip 80 via crosspieces 79 so that actuating pins 81 which are fastened in a springing manner at the strip 80 can press the sensors provided in the plate part 7.

While the foregoing description and drawings represent the preferred embodiments of the present invention, it will be obvious to those skilled in the art that various changes and modifications may be made therein without departing from the true spirit and scope of the present invention.

What is claimed is:

1. A device for coupling loading and unloading devices with semiconductor processing machines, comprising:
   an adjustable receiving element for a loading and unloading device which is provided inside a movable enclosure;
   said receiving element being displaceable between at least two planes situated one above the other, one plane serving for charging the loading and unloading device and every other plane being used for the charging of the semiconductor machine carded out by the loading and unloading device;
   wherein said enclosure has aligning and holding elements for fastening to a coupling element which is aligned with the semiconductor processing machine;
   wherein said enclosure includes a stationary outer part and an extendable inner part which encloses the receiving element together with the loading and unloading device; and
   wherein said inner part can be moved in and out in a telescoping manner together with the receiving element and the loading and unloading device for the purpose of adjusting the receiving element between planes located one above the other.

2. The device according to claim 1, wherein the receiving element is an adjustable plate connected with a lift.

3. The device according to claim 1, wherein the receiving element is an adjustable plate supported by a horizontally movable element attached to a lift.

4. The device according to claim 1, wherein at least one closing element is provided at the telescoping inner part of the enclosure in order to close charging openings in the semiconductor processing machine.

5. The device according to claim 4, wherein the enclosure includes two parts provided with bore holes in their sides remote from the semiconductor processing machine.

6. The device according to claim 5, wherein the inner part has holes in its base.

7. The device according to claim 1, wherein the coupling element is a bottom plate which is adjustable relative to the semiconductor processing machine and has a beveled front edge in which semispherical-cap supporting screws are deposited in shaped elements for the purpose of a positive-locking orientation in accordance with coordinates.

8. The device according to claim 7 wherein a permanent magnet with reversible force is arranged at the stationary part of the enclosure for fastening purposes.

9. The device according to claim 1, wherein the receiving element is supported on a lift driven by a stepper motor connected with a voltage-dependent motor brake.

10. The device according to claim 1, wherein the receiving element is disposed on a lift supported relative to a stationary part of the enclosure by pneumatic springs.

11. The device according to claim 1, wherein the receiving element is supported on a lift driven by a stepper motor and wherein the enclosure includes a stationary part which supports a movable safety hoop in which objects resting on the safety hoop interrupt a normally closed circuit so that the stepper motor is switched off.

* * * * *